United States Patent
Ahmed et al.

(10) Patent No.: US 8,975,706 B2
(45) Date of Patent: Mar. 10, 2015

(54) GATE STACKS INCLUDING $TA_xSI_yO$ FOR MOSFETS

(71) Applicant: Intermolecular, Inc., San Jose, CA (US)

(72) Inventors: Khaled Ahmed, Anaheim, CA (US); Frank Greer, Pasadena, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/135,381

(22) Filed: Dec. 19, 2013

(65) Prior Publication Data

US 2015/0041912 A1 Feb. 12, 2015

Related U.S. Application Data

(60) Provisional application No. 61/862,926, filed on Aug. 6, 2013.

(51) Int. Cl.
*H01L 21/28* (2006.01)
*H01L 27/092* (2006.01)

(52) U.S. Cl.
CPC ........ *H01L 21/28158* (2013.01); *H01L 27/092* (2013.01)
USPC ............ 257/369; 257/E21.212; 257/E21.409; 257/E27.06; 257/E29.06; 438/591; 438/151; 438/257; 438/197

(58) Field of Classification Search
CPC .............. H01L 21/0215; H01L 21/336; H01L 21/3141; H01L 21/31637; H01L 27/088; H01L 29/78; H01L 2924/1026; H01L 2224/05181; H01L 21/28158; H01L 27/092
USPC .................. 257/213, 369, 410, 411, E21.212, 257/E21.409, E27.06, E29.06, E29.051, 257/E51.006; 438/591, 151, 257, 197
See application file for complete search history.

(56) References Cited

U.S. PATENT DOCUMENTS 7,326,655 B2  2/2008 Joe
7,361,608 B2  4/2008 Ko et al.
(Continued)

OTHER PUBLICATIONS

Afanas'Ev, et al.; Charge instability of atomic-layer deposited TaSiOx insulators on Si, InP, and In0.53Ga0.47As; May 15, 2012; Applied Physics Letters; American Institute of Physics; pp. 202104-1-202104-4.

(Continued)

*Primary Examiner* — Matthew Reames
*Assistant Examiner* — Nilufa Rahim

(57) ABSTRACT

Provided are field effect transistor (FET) assemblies and methods of forming thereof. An FET assembly may include a dielectric layer formed from tantalum silicon oxide and having the atomic ratio of silicon to tantalum and silicon (Si/(Ta+Si)) of less than 5% to provide a low trap density. The dielectric layer may be disposed over an interface layer, which is disposed over a channel region. The same type of the dielectric layer may be used a common gate dielectric of an nMOSFET (e.g., III-V materials) and a pMOSFET (e.g., germanium). The channel region may include one of indium gallium arsenide, indium phosphate, or germanium. The interface layer may include silicon oxide to provide a higher energy barrier. The dielectric layer may be formed using an atomic layer deposition technique by adsorbing both tantalum and silicon containing precursors on the deposition surface and then oxidizing both precursors in the same operation.

12 Claims, 4 Drawing Sheets

(56) References Cited

U.S. PATENT DOCUMENTS

| | | | |
|---|---|---|---|
| 7,432,139 | B2 | 10/2008 | Currie |
| 7,501,349 | B2 | 3/2009 | Dip et al. |
| 8,003,503 | B1 | 8/2011 | Clark |
| 2010/0301428 | A1* | 12/2010 | Forbes et al. ............... 257/410 |
| 2011/0147710 | A1* | 6/2011 | Dewey et al. ................ 257/24 |
| 2012/0032332 | A1* | 2/2012 | Lim et al. .................... 257/751 |
| 2013/0149852 | A1 | 6/2013 | Nakamura et al. |
| 2013/0224964 | A1* | 8/2013 | Fukazawa et al. ........... 438/765 |
| 2014/0035001 | A1* | 2/2014 | Czornomaz et al. ......... 257/192 |

OTHER PUBLICATIONS

Majumdar, et al.; HFinFET: A Scalable, High Performance, Low Leakage Hybrid n-Channel FET; May 14, 2010; IEEE Transactions on Nanotechnology, vol. 9, No. 3; IEEE; pp. 342-344.

Wei, et al; Valence band offset of β-Ga2O3/wurtzite GaN heterostructure measured by X-ray photoelectron spectroscopy; 2012; Nanoscale Research Letters; Springer; pp. 1-5.

Chin, et al.; A New Silane-Ammonia Surface Passivation Technology for Realizing Inversion-Type Surface-Channel GaAs N-MOSFET with 160 nm Gate Length and High-Quality Metal-Gate/High-k Dielectric Stack; 4 pages.

Liu, et al.; Diamond-Like Carbon (DLC) Liner with Highly Compressive Stress formed on AlGaN/GaN MOS-HEMTs with in situ Silane Surface Passivation for Performance Enhancement; 2010; IEEE; pp. 11.3.1-11.3.4.

Chung, et al.; Advanced Gate Technologies for State-of-the-art fT in AlGaN/GaN HEMTs; 2010; IEEE; pp. 30.2.1-30.2.4.

* cited by examiner

GATE STACKS INCLUDING TA$_x$SI$_y$O FOR MOSFETS

CROSS-REFERENCE TO RELATED APPLICATIONS

This application claims priority from U.S. Provisional Application No. 61/862,926, filed on 6 Aug. 2013, which is incorporated herein by reference in its entirety for all purposes.

TECHNICAL FIELD

The present invention relates generally to field effect transistor (FET) assemblies and more specifically to FET assemblies including gate stacks with tantalum silicon oxide.

BACKGROUND

A typical FET assembly includes a gate, a source, and a drain. The gate is conventionally formed from a gate insulator and a gate electrode. The gate insulator may be a layer of silicon oxide ($SiO_2$) or silicon oxynitride (SiON) disposed over a silicon substrate. The gate insulator may be also referred to as a gate dielectric or a gate oxide. The gate electrode may be a layer of poly-crystalline silicon (polysilicon) disposed over the gate insulator. The gate electrode and, optionally, the gate insulator layer may be etched from continuous layers to form an appropriately shaped gate structure.

Silicon oxide and silicon oxynitride (as a gate insulator) and polysilicon (as a gate electrode) have been the standard materials for FETs for many years. As transistors have decreased in size, the thickness of the gate insulators had to decrease steadily as well in order to maintain good electrostatic control over the FET channel. However, with the thinning of the gate insulators comes the problem of leakage currents due to tunneling through the gate insulators formed from silicon oxide.

To further reduce the FET size, new high-K dielectric materials for gate insulators are being introduced. Replacing silicon dioxide with high-K materials reduces the leakage effects mentioned above, while improving electrostatic control over the channel. However, high-K materials present a set of new challenges.

SUMMARY

Provided are FET assemblies and methods of forming thereof. An FET assembly may include a dielectric layer formed from tantalum silicon oxide and having the atomic ratio of silicon to tantalum and silicon (Si/(Ta+Si)) of less than about 5% to provide a low trap density. The dielectric layer may be disposed over an interface layer, which is disposed over a channel region. The same type of the dielectric layer may be used a common gate dielectric of an nMOSFET (e.g., III-V materials) and a pMOSFET (e.g., germanium). The channel region may include one of indium gallium arsenide, indium phosphate, or germanium. The interface layer may include silicon or, more specifically, silicon oxide to provide a higher energy barrier. The dielectric layer may be formed using an atomic layer deposition (ALD) technique by adsorbing both tantalum and silicon containing precursors on the deposition surface and then oxidizing both precursors in the same operation.

In some embodiments, a method of forming a FET assembly involves providing a channel region, forming an interface layer over the channel region, and forming a dielectric layer over the interface layer such that the interface layer is disposed between the channel region and the dielectric layer. The dielectric layer includes a tantalum silicon oxide, and the atomic ratio of silicon to a combination of tantalum and silicon in the tantalum silicon oxide (calculated by Si/(Si+Ta)) may be less than about 5% or, more specifically, less than about 3%. The channel region may include one of indium gallium arsenide, indium phosphate, germanium, germanium tin, or gallium antimony. The interface layer may include silicon or, more specifically, silicon oxide. For example, forming an interface layer may involve depositing a layer of silicon that is later oxidized to form silicon oxide. In some embodiments, the dielectric layer has a thickness of less than 2 nanometers. The interface layer may have a thickness of less than 0.7 nanometers.

In some embodiments, the dielectric layer is formed using an atomic layer deposition (ALD) technique. Specifically, forming the dielectric layer may involve supplying a tantalum containing precursor into a deposition chamber such that the tantalum containing precursor adsorbs on a surface of the interface layer and supplying a silicon containing precursor into the deposition chamber such that the silicon containing precursor also adsorbs on the surface of the interface layer having the tantalum containing precursor adsorbed thereon. After both tantalum containing precursor and silicon containing precursor are present on the surface of the interface layer, an oxygen containing reagent is supplied into the deposition chamber such that the oxygen containing reagent reacts with the silicon containing precursor and the tantalum containing precursor thereby forming the tantalum silicon oxide of the dielectric layer on the surface of the interface layer.

In some embodiments, the process also involves forming a capping layer over the dielectric layer. The capping layer may include titanium nitride. After forming the dielectric layer and until forming the capping layer the dielectric layer is maintained in an oxygen free environment. This prevents uncontrolled oxidation of the tantalum silicon oxide in the dielectric layer thereby the concentration of oxygen and/or stoichiometry of the tantalum silicon oxide is maintained.

In some embodiments, after forming the interface layer and until forming the dielectric layer the interface layer is maintained in an oxygen free environment. For purposes of this document, the oxygen free environment is defined as an environment that does not cause substantially oxidation of a material exposed to this environment. Specifically, the oxygen concentration of the materials exposed to the oxygen free environment may increase by less than 1% atomic, if increased at all. The oxygen free environment may be achieved by reducing the partial pressure of oxygen to a suitable that does not cause the level of oxidation listed above. As such, this partial pressure of oxygen depends on the materials exposed to the oxygen free environment, exposure duration, exposure temperature, and other conditions. The partial pressure of oxygen by diluting oxygen with other gases, such as inert gases, and/or reducing the overall pressure of the environment. This prevents uncontrolled oxidation of the material in the interface layer thereby the concentration of oxygen in it is maintained. The interface layer is formed using an ALD technique.

In some embodiments, the method also involves cleaning a surface of the channel region used to form the interface layer thereon. This cleaning operation is performed prior to forming the interface layer. The surface of the channel region is cleaned using atomic hydrogen.

Also provided is a FET assembly including a channel region, an interface layer disposed over the channel region, and a dielectric layer disposed over the interface layer such that the interface layer is disposed between the channel region and the dielectric layer. The dielectric layer includes a tantalum silicon oxide. The atomic ratio of silicon to a combination of tantalum and silicon in the tantalum silicon oxide (calculated by Si/(Si+Ta)) is less than about 5% or, more specifically, less than about 3%. The interface layer includes silicon, which may be in the form of silicon oxide. In some embodiments, the channel region includes one of indium gallium arsenide, indium phosphate, germanium, germanium tin, or gallium antimony. The dielectric layer has a thickness of less than 2 nanometers, and wherein the interface layer has a thickness of less than 0.7 nanometers.

In some embodiments, the FET assembly also includes a n-metal oxide semiconductor field effect transistor (nMOSFET), which may be based on III-V materials) and a p-metal oxide semiconductor field effect transistor (pMOSFET), which may be based on germanium. The dielectric layer may be operable as a gate dielectric of the nMOSFET and as a gate dielectric of the pMOSFET. In some embodiments, the dielectric layer has a dielectric strength of at least about 20.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION OF EXAMPLE EMBODIMENTS

Figure 1:
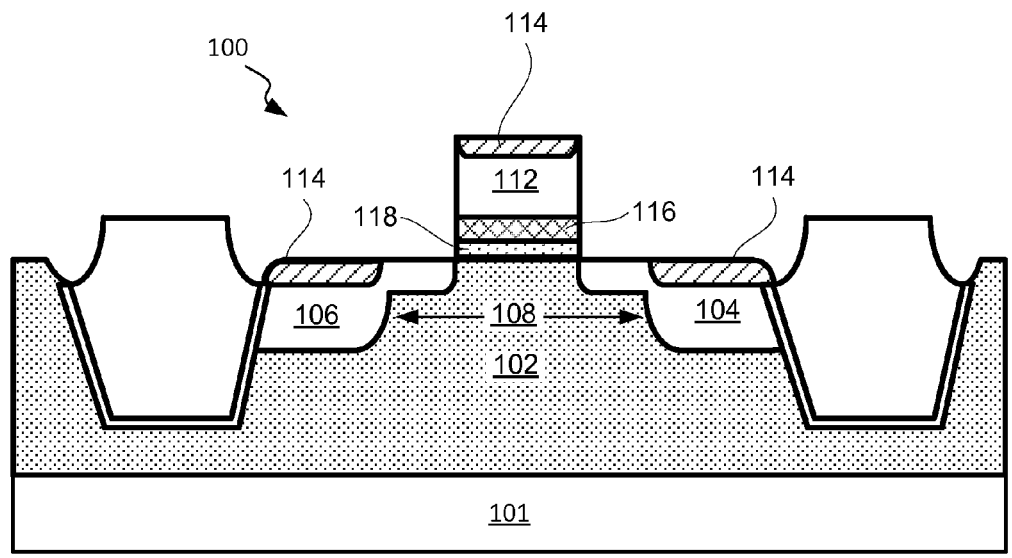
FIG. 1 illustrates a schematic representation of a FET assembly, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

INTRODUCTION

The continuous device scaling and performance improvement requirements of semiconductor devices in general and FETs in particular face significant challenges as conventional silicon-based FETs come to their fundamental physical limits. As new technologies, such as high-k metal gates, non-planar silicon transistors, and strained channel materials are developed, additional efforts are needed find new channel materials, such as germanium and III-V materials. At the same time, some of these new channel materials present certain requirements to top-gate dielectric stacks in order to sustain their transport propertied and maintain the device performance at or above the benchmark set by the silicon-based FETs.

One aspects of the silicon-based FETs that was difficult to replicate with new materials is silicon oxide-to-silicon interface, which has a high quality and a mid-bandgap interface-trap density of about $10^{10}/cm^2$-eV for thermally grown silicon oxide on a hydrogen-terminated silicon surface. Suitable gate dielectrics or passivation layers on III-V compound semiconductors have been researched for more than four decades (since introduction of polysilicon gate in the 1960s) with very limited success up until now.

Provided are FET assemblies and methods of forming thereof. In some embodiments, a gate stack may be formed on III-V or germanium semiconductors with small equivalent oxide thickness, such as less than about 5 nanometers and even less than about 2 nanometers. In some embodiments, the gate stack has equivalent oxide thickness of about 1 nanometer. The gate stack may have low interface trap density, which is particularly useful for III-V or germanium channel metal-oxide-semiconductor FETs (MOSFETs) or quantum well field FETs (QWFETs).

Specifically, an FET assembly may include a dielectric layer formed from tantalum silicon oxide with the atomic ratio of silicon to tantalum and silicon (Si/(Ta+Si)) of less than 5% to provide a low trap density. In some embodiments, this atomic ratio is less than 3%. Higher amounts of silicon have shown significant charge trapping due to a low band offset between tantalum silicon oxide (TaSiOx) and specific semiconductor materials, such indium gallium arsenide (InGaAs) or indium phosphate (InP).

In some embodiments, the dielectric layer may be disposed over an interface layer, which is disposed over a channel region. In other words, the interface layer may be disposed between the channel region and the dielectric layer such that the dielectric layer does not directly interfaces the channel region. The interface layer may be formed from silicon and may have a thickness of less than 1 nanometer or, more specifically, less than 0.7 nanometers. The interface layer is used to provide a higher energy barrier.

The dielectric layer may be formed using a specially configured ALD technique. Unlike a convention ALD technique, in which a single precursor is adsorbed on a deposition surface and then oxidized, the specially configured ALD technique described herein involves adsorbing two precursors on the same surface prior to an oxidizing operation. These two adsorption operations may be performed in a sequence. For example, a tantalum containing precursor may be adsorbed first followed by adsorption of a silicon containing precursor. It should be noted that the tantalum containing precursor is not oxidized prior to adsorption of the silicon containing precursor, but both tantalum containing precursor and silicon containing precursor are oxidized in the same operation. The adoption conditions for each of the two precursors are selected to achieve a specific atomic ratio of silicon to the combination of tantalum and silicon (calculated by Si/(Si+Ta)), such as less that 5%.

Semiconductor Device Examples

FIG. 1 illustrates a schematic representation a FET assembly 100, in accordance with some embodiments. The references below are made to pMOS devices but other types of devices, such as nMOS and CMOS, can be used and will be understood by one having ordinary skill in the art. FET assembly 100 may include a substrate 101 and a channel region 102 formed on substrate 101. Substrate 101 may be a part of a wafer including other FETs and/or other devices. Channel region 102 may include one of indium gallium arsenide, indium phosphate, germanium, germanium tin, or gallium antimony.

FET assembly 100 also includes a conductive gate electrode 112 that is separated from channel region 102 by dielectric layer 116 and, in some embodiments, by interface layer 118. Various aspects of dielectric layer 116 and interface layer 118 are described below with reference to FIG. 2. Gate electrode 112 may include any suitable material. In some embodiment, gate electrode 112 is made from nickel, gold, polysilicon, polysilicon doped with a p-type dopant (e.g., boron), or other suitable materials.

FET assembly 100 also includes p-doped source region 104 and drain region 106 (or simply the source and drain) in channel region 102. Source 104 and drain 106 are located on each side of dielectric layer 116 forming channel 108 within channel region 102. Source 104 and drain 106 may include a p-type dopant, such as boron. Additionally, source 104 and drain 106 may be formed in recesses of channel regions 102.

In some embodiment, source 104 and drain 106 and gate electrode 112 are covered with a layer of self-aligned silicide portions 114, which may be also referred to as salicide portions or simply salicides. For example, a layer of cobalt is deposited as a blanket and thermally treated to form these portions 114. Alternatively, nickel or other refractory metals, such as tungsten, titanium, and palladium, and are suitable for forming silicide portions 114.

Figure 2:
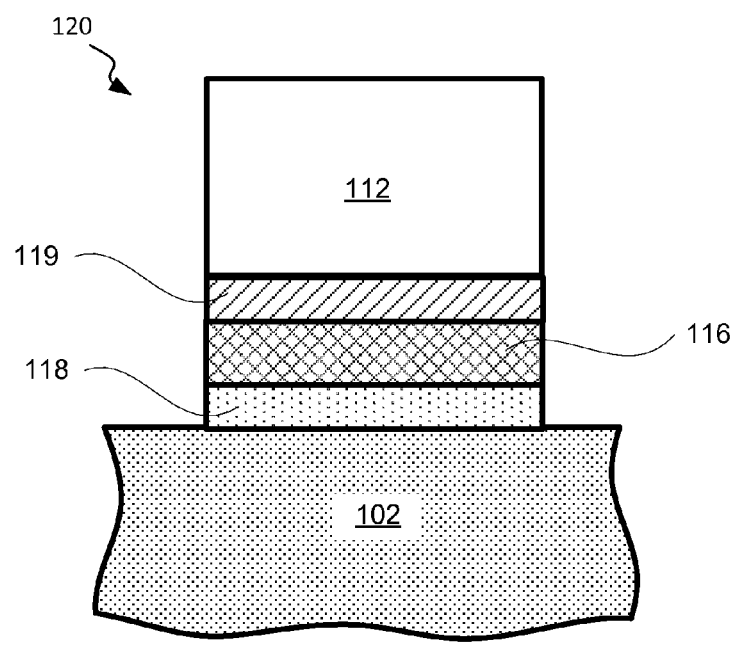
FIG. 2 illustrates a schematic representation of a portion of the FET assembly presented in FIG. 1 focusing on the channel region, interface layer disposed over the channel region, and dielectric layer disposed over the interface layer, in accordance with some embodiments.

FIG. 2 illustrates a schematic representation of a portion 120 of FET assembly 100, which is presented in FIG. 1, focusing on channel region 102, interface layer 118 disposed over channel region 102, and dielectric layer 116 disposed over interface layer 118, in accordance with some embodiments. In other words, interface layer 118 is disposed between dielectric layer 116 and channel region 102. FIG. 2 illustrates an optional capping layer 119 disposed over dielectric layer 116. Gate electrode 112 is also shown in this figure for reference. Capping layer 119, if one is present, is disposed between dielectric layer 116 and gate electrode 112.

Dielectric layer 116 may be formed from tantalum silicon oxide. The atomic ratio of silicon to a combination of tantalum and silicon in the tantalum silicon oxide (calculated by Si/(Si+Ta)) may be less than 5% or, more specifically, less that 3%. The lower amount of silicon in dielectric layer 116 in comparison to conventionally used tantalum silicon oxides, which have substantially the same concentrations of tantalum and silicon, allow significant reduction in trap density in dielectric layer 116. In some embodiments, the atomic ratio may be greater than about 1% or even greater than about 2%. For example, the atomic ratio may be between about 1% and 5% or, more specifically, between about 2% and 3%. Dielectric layer 116 has a thickness of less than 3 nanometers or, more specifically, less than 2 nanometers and even less than 1.5 nanometers. The upper limit for the thickness of dielectric layer may be 3 nanometers, in some embodiments. Such low physical thicknesses allow having low equivalent oxide thicknesses (EOTs). Furthermore, these thicknesses are achievable using ALD techniques, since each ALD cycle deposits between about 0.05 nanometers and 0.2 nanometers. As such, a few (5-20) ALD cycles may be used to form. Dielectric layer 116 may have a dielectric constant of at least about 20 or, more specifically, of at least about 30 or even of at least about 35.

Interface layer 118 may be formed from silicon. In some embodiments, interface layer 118 may be formed from aluminum oxide. In some embodiments, interface layer 118 has a thickness of less than 0.7 nanometers or, more specifically, less than 0.5 nanometers. These thicknesses are achievable using ALD techniques. In some embodiments, interface layer 118 and dielectric layer 116 are formed in the same ALD chamber without breaking the vacuum in between deposition of these two structures. In this case, oxidation of interface layer 118 is prevented.

Capping layer 119 may be formed from titanium nitride. In some embodiments, capping layer 119 is formed using ALD techniques or, more specifically, in the same ALD chamber that was used to form dielectric layer 116 and without breaking the vacuum in between forming these two structures. In this case, oxidation of dielectric layer 116 is prevented.

Processing Examples

Figure 3:
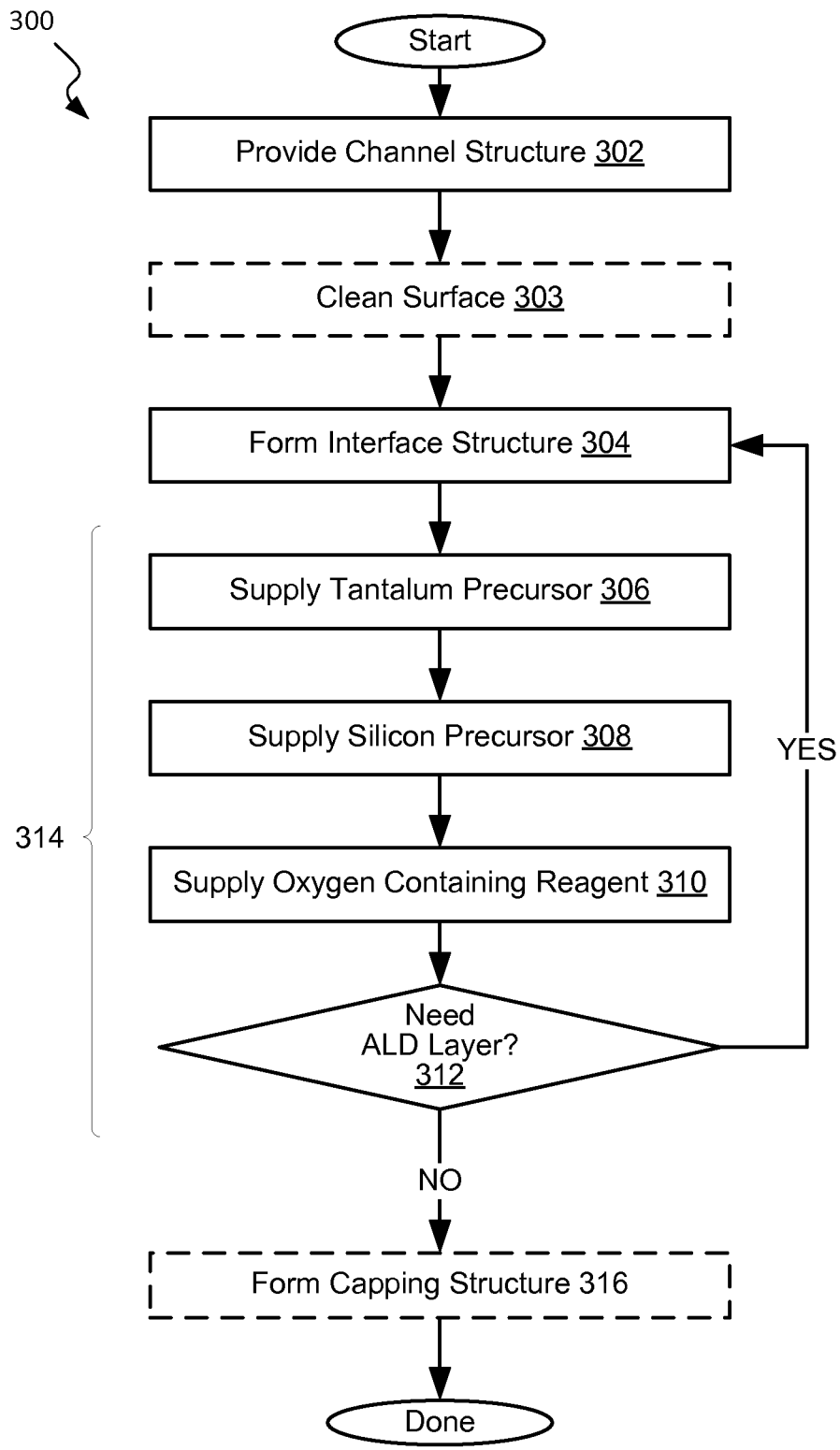
FIG. 3 is a process flowchart corresponding to a method of forming a FET assembly, in accordance with some embodiments.

FIG. 3 illustrates a process flow chart corresponding to method 300 of forming a FET assembly, in accordance with some embodiments. Method 300 may commence with providing a channel region during operation 302. Various examples of channels structures are described above with reference to FIG. 1. In some embodiments, the channel region includes one of indium gallium arsenide, indium phosphate, germanium, germanium tin, or gallium antimony.

Method 300 may proceed with cleaning the surface of the channel region during an optional operation 303. Specifically, atomic hydrogen clean to may be used to remove native oxides and hydrocarbons from the surface of the channel region. The atomic hydrogen may be generated using remote plasma or hot wire techniques, which would be appreciated by one having ordinary skills in the art.

Method 300 may proceed with forming an interface layer over the channel region during operation 304. The interface layer may be formed using an ALD or any other suitable technique. For example, hydrogen radical-enhanced ALD may be used to form an interface layer including silicon. The surface chemistry may be based on desorption kinetics for $H_2$, HCl, and $SiCl_2$ from silicon surfaces. Precursors such as dichlorosilane ($SiH_2Cl_2$), (3-Aminopropyl)triethoxysilane ($H_2N(CH_2)_3Si(OC_2H_5)_3$), n-sec-Butyl(trimethylsilyl)amine ($C_7H_{19}NSi$), chloropentamethyldisilane (($CH_3)_3SiSi(CH_3)_2Cl$), 1,2-dichlorotetramethyldisilane ($[ClSi(CH_3)_2]_2$), 1,3-diethyl-1,1,3,3-tetramethyldisilazane ($C_8H_{23}NSi_2$), 1,2-dimethyl-1,1,2,2-tetraphenyldisilane (($SiCH_3(C_6H_5)_2)_2$), dodecamethylcyclohexasilane (($Si(CH_3)_2)_6$), hexamethyldisilane (($Si(CH_3)_3)_2$), hexamethyldisilazane, $(CH_3)_3SiNHSi(CH_3)_3$, methylsilane ($CH_3SiH_3$), 2,4,6,8,10-pentamethylcyclopentasiloxane (($CH_3SiHO)_5$), pentamethyldisilane (($CH_3)_3SiSi(CH_3)_2H$), silicon tetrabromide ($SiBr_4$), silicon tetrachloride ($SiCl_4$), tetraethylsilane ($Si(C_2H_5)_4$), 2,4,6,8-tetramethylcyclotetrasiloxane (($HSiCH_3O)_4$), 1,1,2,2-Tetramethyldisilane (($CH_3)_2SiHSiH(CH_3)_2$), tetramethylsilane ($Si(CH_3)_4$), n,n',n"-tri-tert-butylsilanetriamine ($HSi(HNC(CH_3)_3)_3$), tris(tert-butoxy)silanol ((($CH_3)_3CO)_3SiOH$), and tris(tert-pentoxy)silanol (($CH_3CH_2C(CH_3)_2O)_3SiOH$).

Method 300 may then proceed with forming a dielectric layer over the interface layer during operation 314. As described above, the dielectric layer includes a tantalum silicon oxide and the atomic ratio of silicon to a combination of tantalum and silicon in the tantalum silicon oxide (calculated by Si/(Si+Ta)) is less than about 5% or, more specifically, less than about 3%. The dielectric layer may be formed using an ALD technique. Specifically, operation 314 may involve supplying a tantalum containing precursor into the deposition chamber during sub-operation 306. The tantalum containing precursor adsorbs on the surface of the channel region. Operation 314 then proceeds with supplying a silicon containing precursor into the deposition chamber during sub-operation 308. The silicon containing precursor adsorbs on the surface of the channel region that already has the tantalum containing precursor adsorbed thereon. Operation 314 then involves supplying an oxygen containing reagent into the deposition chamber during sub-operation 310. The oxygen containing reagent reacts with the silicon containing precursor and the tantalum containing precursor adsorbed on the surface of the channel region thereby forming the tantalum silicon oxide. In some embodiments, sub-operations 306, 308, and 310 are repeated at least once as indicated by the decision block 312. For example, each ALD cycle may form between about 0.05 nanometers and 0.2 nanometers thick layer. As such, a few (5-20) ALD cycles may be used to form the entire dielectric layer.

Various examples of silicon containing precursors are presented above. Examples of tantalum containing precursors include pentakis (dimethylamino) tantalum ($Ta(N(CH_3)_2)_5$), tris(diethylamido)(tert-butylimido)tantalum (($CH_3)_3CNTa(N(C_2H_5)_2)_3$), tris(diethylamido)(ethylimido)tantalum ($C_2H_5NTa(N(C_2H_5)_2)_3$), tris(ethylmethylamido)(tert-butylimido)tantalum ($C_{13}H_{33}N_4Ta$).

Figure 4A:
FIGS. 4A-4D illustrate schematic representations of a subassembly at various stages during forming a FET assembly, in accordance with some embodiments.
Figure 4B:
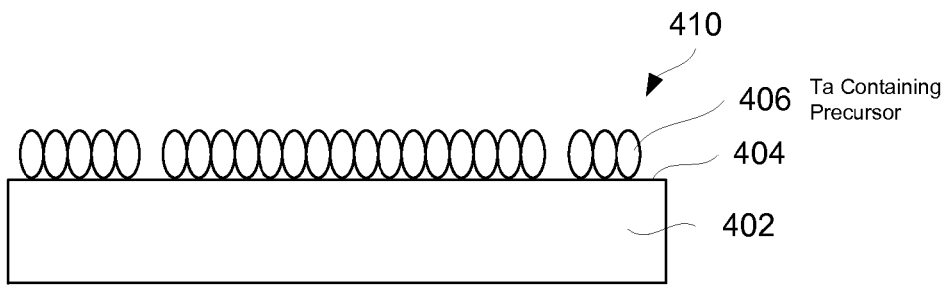

ALD techniques will now briefly described with reference to FIGS. 4A-4D to provide better understanding of various processing features associated with method 300. Specifically, FIG. 4A illustrates a schematic representation of a partially fabricated FET assembly 400 that includes interface layer 402 having surface 404 for depositing a dielectric layer, in accordance with some embodiments. This partially fabricated FET assembly 400 may be present prior to executing operation 314 or any sub-operations of this operation. A precursor containing tantalum or silicon is introduced into the ALD chamber and allowed to flow over the substrate surface, which may be a top surface of a previously deposited ALD layer, or a surface of the interface layer. The precursor may be introduced in the form of a pulse. The tantalum containing precursor may be introduced first during sub-operation 306 and allowed to at least partially adsorb (e.g., saturatively chemisorb or physisorb) on the deposition surface. Subsequent purging with a purging gas removes any tantalum containing precursor that did not adsorb on the surface. FIG. 4B illustrates a schematic representation of a partially fabricated FET assembly 410 that shows tantalum containing precursor molecules 406 adsorbed on surface 404 of interface layer 402. Some of surface 404 may remain exposed and available for adsorption of the silicon containing precursor provided in a subsequent sub-operation. The surface coverage of surface 404 with tantalum containing precursor molecules 406 may determine concentration of silicon in the resulting tantalum silicon oxide layer.

Figure 4C:
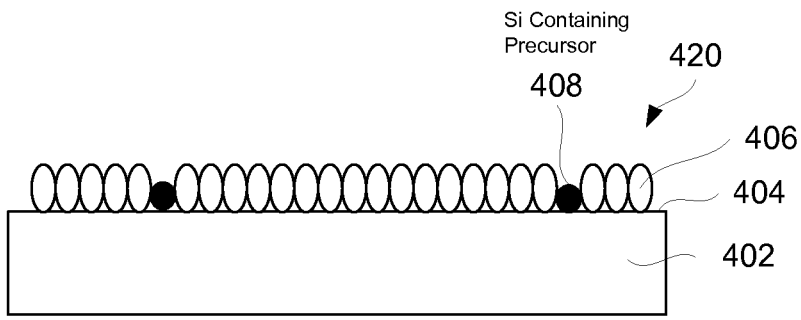
Figure 4D:
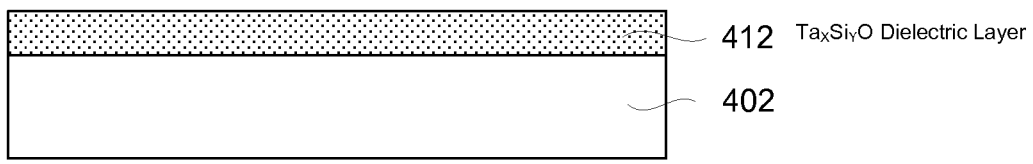

After pulsing and purging of the tantalum containing precursor during sub-operation 306, operation 314 continues with introducing a silicon containing precursor during operation 308. The silicon containing precursor may be also introduced in the form of a pulse and allowed to adsorb on the deposition surface that already has the adsorbed tantalum containing precursor. Subsequent purging with a purging gas removes any silicon containing precursor that did not adsorb on the surface. FIG. 4C illustrates a schematic representation of a partially fabricated FET assembly 420 that shows tantalum containing precursor molecules 406 and silicon containing precursor molecules 408 adsorbed on surface 404 of interface layer 402. The relative concentration of tantalum containing precursor molecules 406 and silicon containing precursor molecules 408 on surface 404 at this stage may determine the concentration of tantalum and silicon in the resulting tantalum silicon oxide layer.

Operation 314 continues with introduction of an oxygen containing reagent into the chamber during sub-operation 310. Some examples of oxygen containing reagents include molecular oxygen, ozone, water, oxygen plasma, oxides of nitrogen, and alcohols. The oxygen containing reagent reacts with the adsorbed tantalum containing precursor and silicon containing precursor to form the tantalum silicon oxide. Reaction byproducts and excess reactants are then purged from the deposition chamber. The saturation during the reaction and purging stages makes the growth self-limiting. This feature helps to improve deposition uniformity and conformality and allows more precise control of the resulting resistive switching characteristics.

The temperature of the substrate during ALD may be between about 200° C. to 350° C. The precursor may be either in gaseous phase, liquid phase, or solid phase. If a liquid or solid precursor is used, then it may be transported into the chamber an inert carrier gas, such as helium or nitrogen.

Method may also involve forming a capping layer over the dielectric layer during optional operation 316. After forming the dielectric layer and until forming the capping layer, the dielectric layer may be maintained in an oxygen free environment. For example, the dielectric layer and the capping layer may be formed in the same chamber (e.g., in the same ALD chamber) without breaking vacuum in the chamber.

Apparatus Examples

Figure 5:
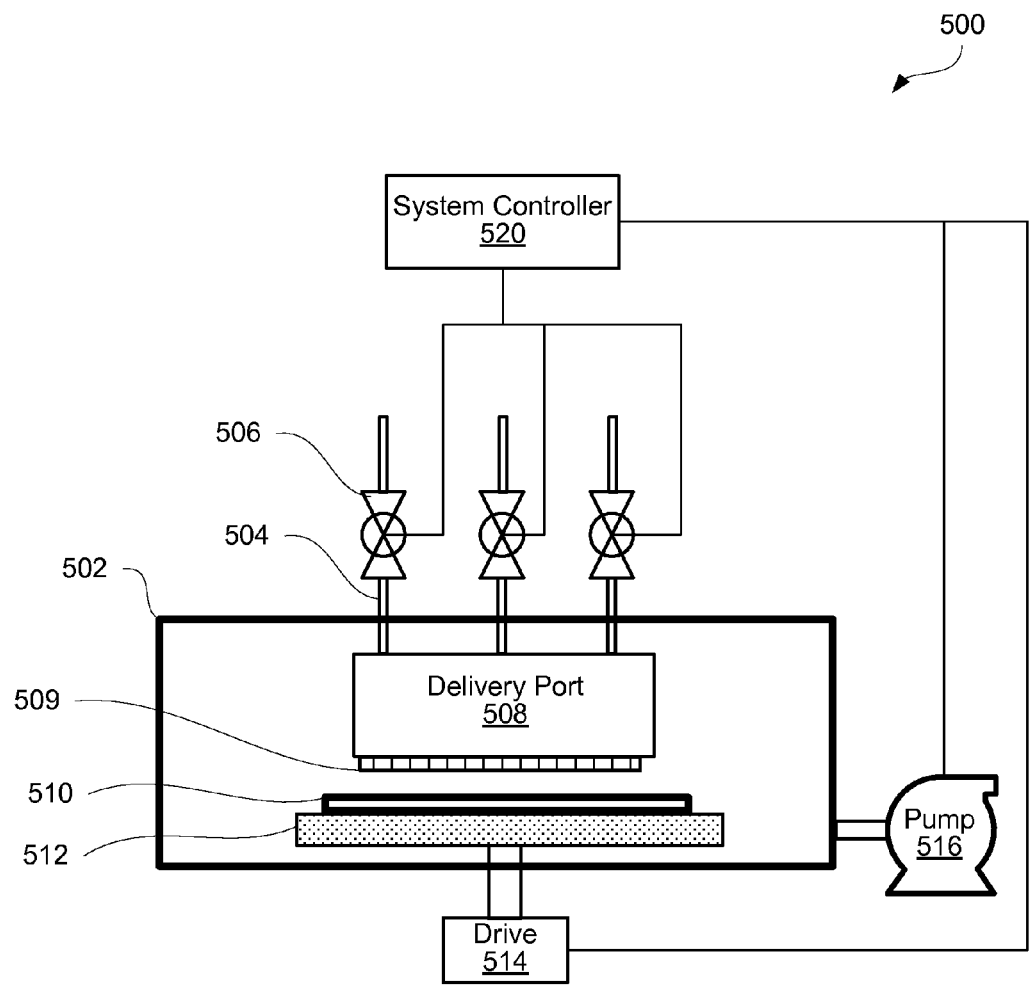
FIG. 5 illustrates a schematic representation of an ALD apparatus for fabricating FET assemblies, in accordance with some embodiments.

FIG. 5 illustrates a schematic representation of ALD apparatus 500 for fabricating FET assemblies, in accordance with some embodiments. For clarity, some components of apparatus 500 are not included in this figure, such as a wafer-loading port, wafer lift pins, and electrical feed-throughs. Apparatus 500 includes deposition chamber 502 connected to processing gas delivery lines 504. While FIG. 5 illustrates three delivery lines 504, any number of delivery lines may be used. Each line may be equipped with a valve and/or mass flow controller 506 for controlling the delivery rates of processing gases into deposition chamber 502. In some embodiments, gases are provided into delivery port 508 prior to exposing substrate 510 to processing gases. Delivery port 508 may be used for premixing gases (e.g., precursors and diluents) and evenly distributing the gases over the surface of substrate 510. Delivery port 508 is sometimes referred to as a showerhead. Delivery port 508 may include a diffusion plate 509 having with multiple holes for gas distribution.

Deposition chamber 502 encloses substrate support 512 for holding substrate 510 during its processing. Substrate support 512 may be made from a thermally conducting metal (e.g., W, Mo, Al, Ni) or other like materials (e.g., a conductive ceramic) and may be used to maintain the substrate temperature at desired levels. Substrate support 512 may be connected to drive 514 for moving substrate 510 during loading, unloading, process set-up, and sometimes even during processing. Deposition chamber 502 may be connected to vacuum pump 516 for evacuating reaction products and unreacted gases from deposition chamber 502 and for maintaining the desirable pressure inside chamber 502.

Apparatus 500 may include system controller 520 for controlling process conditions during electrode and resistive switching layer deposition and other processes. Controller 520 may include one or more memory devices and one or more processors with a CPU or computer, analog and/or digital input/output connections, stepper motor controller boards, etc. In some embodiments, controller 520 executes system control software including sets of instructions for controlling timing, gas flows, chamber pressure, chamber temperature, substrate temperature, RF power levels (if RF components are used, e.g., for process gas dissociation), and other parameters. Other computer programs and instruction stored on memory devices associated with controller may be employed in some embodiments.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method of forming a FET assembly, the method comprising:
   providing a channel region;
   forming an interface layer over the channel region; and
   forming a dielectric layer over the interface layer such that the interface layer is disposed between the channel region and the dielectric layer,
   the dielectric layer comprising a tantalum silicon oxide,
   wherein an atomic ratio of silicon to a total amount of silicon and tantalum is less than 0.05,
   wherein forming the dielectric layer comprises:
     supplying a tantalum containing precursor into a deposition chamber such that the tantalum containing precursor adsorbs on a surface of the interface layer,
     after the tantalum containing precursor is adsorbed on the surface of the interface layer, supplying a silicon containing precursor into the deposition chamber such that the silicon containing precursor adsorbs on the surface of the interface layer already having the tantalum containing precursor previously adsorbed on the surface of the interface layer, wherein, after supplying the silicon containing precursor into the deposition chamber an amount of the silicon containing precursor adsorbed on the surface of the interface layer is less than an amount of the tantalum containing precursor adsorbed on the surface of the interface layer, and
     after the tantalum containing precursor and the silicon containing precursor are adsorbed on the surface of the interface layer, supplying an oxygen containing reagent into the deposition chamber such that the oxygen containing reagent reacts with the silicon containing precursor and the tantalum containing precursor adsorbed on the surface of the interface layer thereby forming the tantalum silicon oxide.

2. The method of claim 1, further comprising forming a capping layer over the dielectric layer.

3. The method of claim 2, wherein the capping layer comprises titanium nitride.

4. The method of claim 2, wherein after forming the dielectric layer and until forming the capping layer the dielectric layer is maintained in an oxygen free environment.

5. The method of claim 1, wherein after forming the interface layer and until forming the dielectric layer the interface layer is maintained in an oxygen free environment.

6. The method of claim 1, wherein the interface layer is formed using an ALD technique.

7. The method of claim 1, further comprising, prior to forming the interface layer, cleaning a surface of the channel region used to form the interface layer thereon.

8. The method of claim 7, wherein the surface of the channel region is cleaned using atomic hydrogen.

9. The method of claim 1, wherein the interface layer comprises silicon.

10. The method of claim 1, wherein the channel region comprises one of indium gallium arsenide, indium phosphate, germanium, germanium tin, or gallium antimony.

11. The method of claim 1, wherein the dielectric layer has a thickness of less than 2 nanometers.

12. The method of claim 1, wherein the interface layer has a thickness of less than 0.7 nanometers.

\* \* \* \* \*